United States Patent [19]

Miyanomae et al.

[11] Patent Number: 5,637,145
[45] Date of Patent: Jun. 10, 1997

[54] METHOD OF VAPOR PHASE EPITAXIAL GROWTH

[75] Inventors: Yoshihiro Miyanomae, Numazu; Nobuo Kashiwagi, Shizuoka-ken, both of Japan

[73] Assignee: Toshiba Machine Co., Ltd., Tokyo, Japan

[21] Appl. No.: 586,934

[22] Filed: Jan. 3, 1996

[30] Foreign Application Priority Data

Jan. 6, 1995 [JP] Japan .................................. 7-000578

[51] Int. Cl.$^6$ .................................................... C30B 23/02
[52] U.S. Cl. .................................. 117/84; 117/94; 117/95; 117/97; 438/928; 438/503
[58] Field of Search ........................... 117/2, 84, 94, 117/95, 97; 427/248.1; 437/225, 227, 228 SE, 228 CR

[56] References Cited

U.S. PATENT DOCUMENTS 3,634,150  1/1972  Horn ........................... 117/95

FOREIGN PATENT DOCUMENTS 2024616  2/1987  Japan ........................... 117/94
4162515  6/1992  Japan ........................... 117/97

*Primary Examiner*—Felisa Garrett
*Attorney, Agent, or Firm*—Cushman Darby & Cushman Intellectual Property Group of Pillsbury Madison & Sutro, L.L.P.

[57] ABSTRACT

In a vapor phase epitaxial growth process, formation of a silicon nodule on a back side protective film on a wafer is prevented. In the process, a susceptor situated within a reaction chamber is provided with a depression portion for supporting a wafer at a back side peripheral portion thereof. A protection film on a back side peripheral portion of the wafer, which is to be in contact with the susceptor 4 is removed in advance, prior to epitaxial growth. In addition, it is also effective to apply a silicon coating on the surface of the depression portion, prior to the epitaxial growth process.

4 Claims, 3 Drawing Sheets

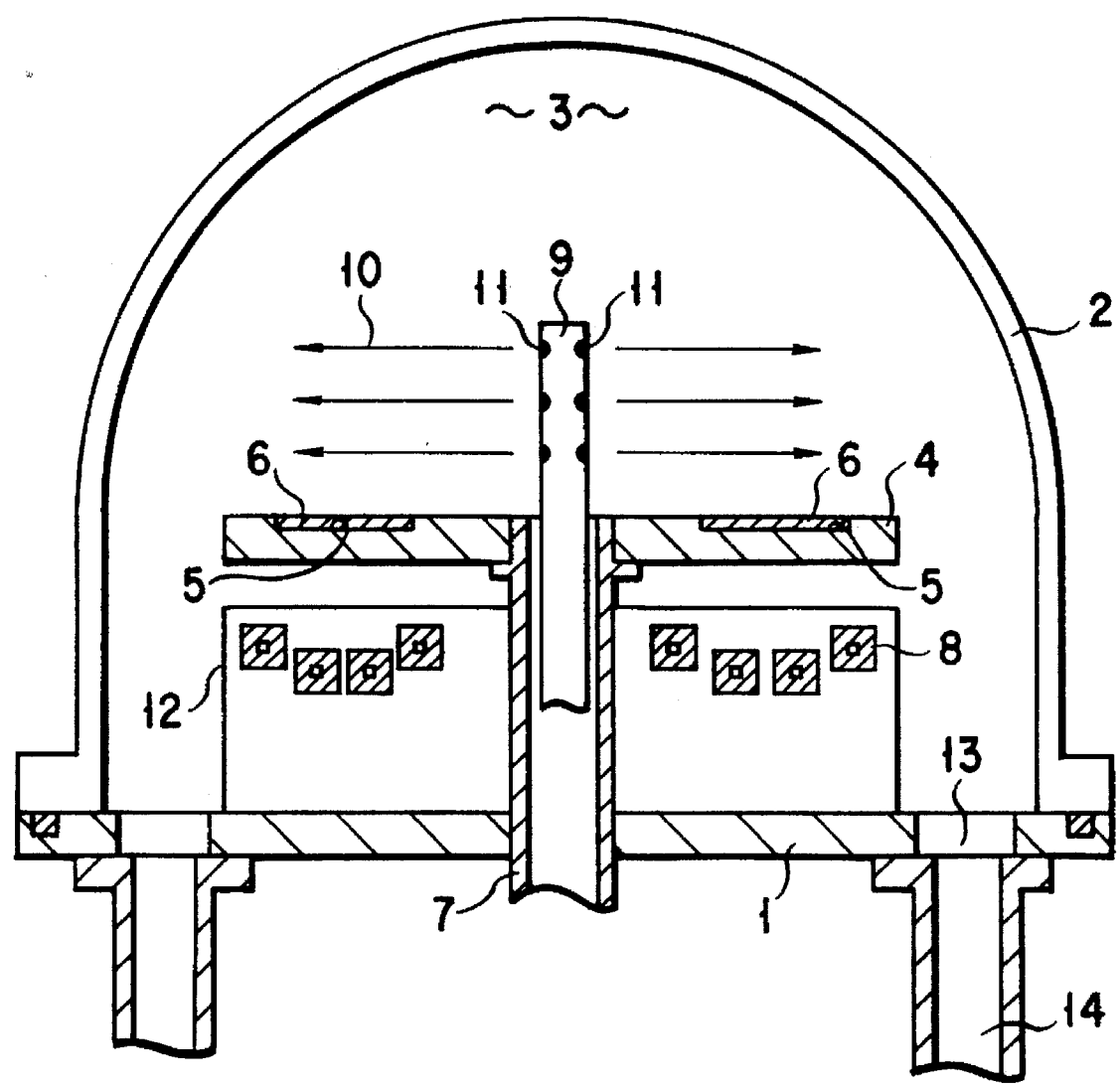
F I G. 1

METHOD OF VAPOR PHASE EPITAXIAL GROWTH

BACKGROUND OF THE INVENTION

1. Field of the Invention

The present invention relates generally to a method of manufacturing an epitaxial wafer for use in fabricating a semiconductor device, and more particularly to a method of preventing formation of a nodule or a small needle-like projection resulting from abnormal growth of silicon, which poses a serious problem in depositing a semiconductor film on a surface of a wafer by an epitaxial growth process.

2. Description of the Related Art

FIG. 6 schematically shows a member for holding a wafer 21 on a susceptor in a conventional epitaxial growth system. When a semiconductor film is deposited on a surface of the wafer 21 by an epitaxial growth process, a back side protective film 22 consisting of an oxide or a nitride is normally formed to a thickness of about 300 nm on the back surface of the wafer 21, as shown in FIG. 6. Thereby, an impurity due to a dopant contained in the wafer is prevented from diffusing into a reaction chamber through the back surface of the wafer in the course of the epitaxial growth process. The back side protective film 22 is formed over the entire back side surface of the wafer 21. In general, in order to obtain the back side protective film, a protective film of an oxide or a nitride is, at first, formed on the top and back side surfaces of the wafer in a diffusion furnace, etc. Then, when the protective film on the top surface of the wafer surface is polished away for epitaxial growth, in order to prevent chipping at a beveled surface, the protective film 22 is normally removed from the beveled surface 26 (i.e. an arcuately beveled peripheral portion of the wafer).

When a thick epitaxial deposition film needs to be formed, $SiHCl_3$ with a high deposition rate is used as material gas in consideration of productivity. This kind of material gas etches the wafer with HCl or $Cl_2$ produced during the epitaxial growth. Consequently, an impurity due to a dopant contained in the wafer diffuses into the reaction chamber, and the dopant is captured in the epitaxial deposition film and the epitaxial deposition film is contaminated (so-called "auto-dope"). Thus, the function of the back side protective film 22 is very important when this material gas is used.

However, when a semiconductor film is deposited on the surface of the wafer 21 coated with the back side protective film 22 by the epitaxial growth process, a nodule 24 or a needle-like projection of silicon forms on that portion of the protective film 22, which is in direct contact with a susceptor 25, as shown in FIGS. 6 and 7. This phenomenon is considered to occur for the following reason. As is shown in FIG. 8, since the peripheral portion of the wafer 21, which is supported by the susceptor 25, is put in contact with the material gas, the material gas enters a discontinuous portion, e.g. a pore, in particles 23 of the back side protective film 22, silicon grows abnormally and becomes a needle-like projection. If the nodule 24 of silicon forms, a problem such as a focusing error or a damage to a mask due to contact with the nodule 24 will occur. The formation of the nodule 24 becomes conspicuous as the thickness of the deposited silicon film increases. For example, if the thickness of the deposited silicon film is 50 µm to 100 µm, the length of the nodule 24 is 50 µm to 60 µm.

In the prior art, the nodule 24 is mechanically polished away. As a result, the manufacturing cost increases. In addition, if the polishing operation is not exactly performed, the wafer would be damaged.

SUMMARY OF THE INVENTION

The present invention has been made in consideration of the above circumstances, and the object of the invention is to provide a method of vapor phase epitaxial growth, whereby formation of a nodule of silicon on a back side protective film on a wafer can be prevented.

In order to achieve the above object, there is provided a first method. Specifically, in a vapor phase epitaxial growth process, a susceptor situated within a reaction chamber is provided with a depression portion for supporting an object to be processed at a back side peripheral portion thereof. A wafer having a back side protective film is provided. The protective film is removed from the back side peripheral portion of the wafer, which is to be in contact with the depression portion. The wafer, from which the protective film on the back side peripheral portion has been removed, is supported on the depression portion of the susceptor, and a semiconductor film is deposited on the wafer by an epitaxial growth process.

There is also provided a second method for achieving the object. Specifically, in a vapor phase epitaxial growth process, a susceptor situated within a reaction chamber is provided with a depression portion for supporting an object to be processed at a back side peripheral portion thereof. A silicon coating is applied to that portion of a surface of the depression portion, which is to be in contact with the back side peripheral portion of the object. A wafer having a back side protective film is provided. The protective film is removed from the back side peripheral portion of the wafer, which is to be in contact with the depression portion. The wafer, from which the protective film on the back side peripheral portion has been removed, is supported on the depression portion of the susceptor, and a semiconductor film is formed on the wafer by an epitaxial growth process.

According to the first method, in the epitaxial growth process, the semiconductor film is deposited on the back surface of the wafer in the state in which there is no protective film on that portion of the back surface of the wafer, which is in contact with the susceptor. Thus, it is possible to effectively prevent formation of a nodule on a specific portion of the protective film on the wafer, which is in contact with the susceptor.

According to the second method, in addition to the first method, the silicon coating is applied to that portion of the surface of the depression portion, which is in contact with the back side peripheral portion of the wafer. Thus, when the susceptor and wafer have been heated, the silicon coating applied to the surface of the susceptor migrates to the wafer and a silicon film is formed to cover the back side peripheral portion of the wafer. As a result, the impurity due to the dopant contained in the wafer is prevented from diffusing into the inside of the reaction chamber.

This second method is advantageous, in particular, when $SiHCl_3$ is used as material gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross-sectional view schematically showing the structure of a reaction chamber of an epitaxial growth system for working a method of the present invention;

DETAILED DESCRIPTION OF THE PREFERRED EMBODIMENTS

An embodiment of the present invention will now be described.

Figure 2:
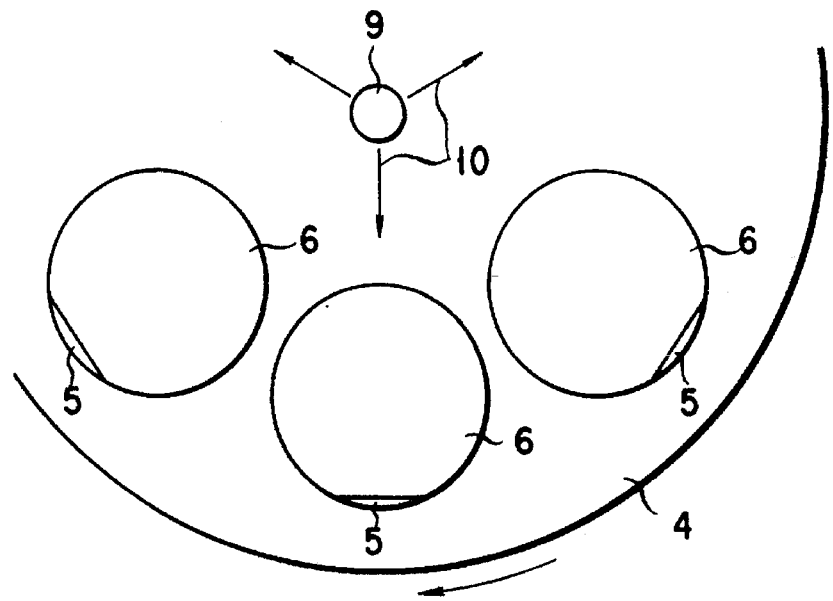
FIG. 2 is a plan view showing a part of the susceptor of the epitaxial growth system shown in FIG. 1.

The structure of a reaction chamber of an epitaxial growth system for working a method of the present invention will now be described with reference to FIGS. 1 and 2.

A sealed container or a bell jar 2 made of quartz is mounted on a base plate 1, thereby constituting a reaction chamber 3.

A susceptor 4 for holding a wafer is provided within the reaction chamber 3. A plurality of depression portions 5 are formed in upper surface portions of the susceptor 4, as shown in FIG. 2. Wafers 6 are supported in the depression portions 5. The susceptor 4 is supported by a rod 7 at a central portion thereof. A rotary drive mechanism (not shown) rotates the rod 7, thereby rotating the susceptor 4. A high-frequency heating coil 8 is situated below the susceptor 4 to heat the susceptor 4. A coil cover 12 made of quartz glass is provided between the susceptor 4 and the high-frequency heating coil 8 so as to entirely cover the high-frequency heating coil 8. Thereby, the high-frequency heating coil 8 is isolated from material gas 10.

A nozzle 9 is provided so as to penetrate central portions of the susceptor 4 and the rod 7. The material gas 10 for epitaxial deposition, which is mixed with a carrier gas, is supplied into the reaction chamber 3 through the nozzle 9. The nozzle 9 comprises a plurality of jet holes 11 for the material gas 10. Thus, the material gas 10 is jetted horizontally (as indicated by arrows). The material gas 10 within the reaction chamber 3 is guided into an exhaust path 14 via an exhaust port 13 formed in the base plate 1.

In the epitaxial growth process, the susceptor 4 is rotated and heated by the high-frequency heating coil 8. After the temperature of the wafers 6 has reached to a predetermined level, the material gas 10 such as $SiHCl_3$ is supplied into the reaction chamber 3 through the nozzle 9. Thereby, epitaxial growth films of silicon are deposited on the surfaces of the wafers 6.

Figure 3:
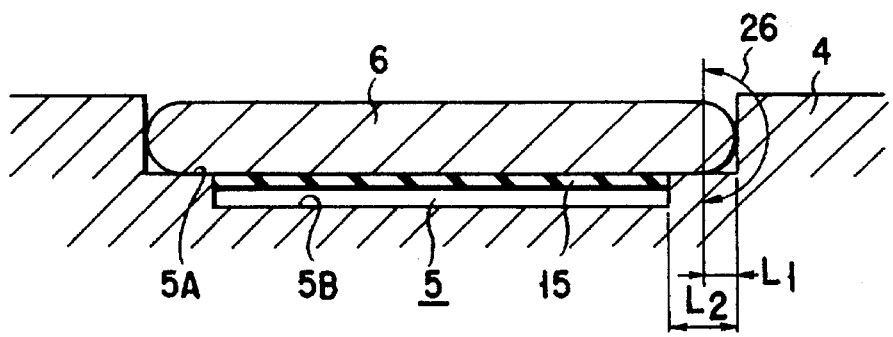
FIG. 3 is a cross-sectional view showing an example of a wafer support member of the susceptor used in the method of the present invention.

FIG. 3 shows the structure of a susceptor of the epitaxial growth system for working the method of the present invention, and the state of the wafer.

As is shown in FIG. 3, the depression portion 5 formed in the susceptor 4 has two stepped portions 5A and 5B in cross section. The stepped portion 5A supports a back side peripheral portion of the wafer 6. The stepped portion 5B is flat and deeper than the stepped portion 5A, and does not come into contact with the back side surface of the wafer 6. A back side protective film 15 consisting of an oxide or a nitride is normally formed to a thickness of about 300 nm on the back side surface of the wafer 6. Thereby, an impurity due to a dopant contained in the wafer 6 is prevented from diffusing into the reaction chamber 3 through the back side surface of the wafer 6 in the course of the epitaxial growth process.

In the method of the present invention, as shown in FIG. 3, the back side protective film 15 is removed from the back side peripheral portion of the wafer 6, that is, that portion of the back side surface of the wafer 6, which is in direct contact with the stepped portion 5A formed in the depression portion of the susceptor 4. Specifically, in the example shown in FIG. 3, the back side protective film 15 is mechanically polished away from the back side peripheral portion in the width range of about 2 mm.

Figure 7:
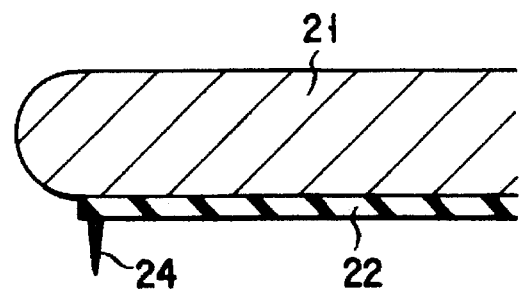
FIG. 7 is a view showing the state in which a nodule of silicon has grown in a conventional method.
Figure 8:
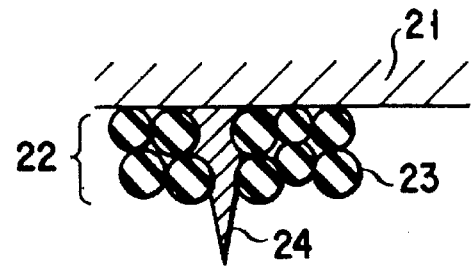
FIG. 8 is an enlarged view of a region including the nodule shown in FIG. 7.

Using the wafer 6 processed as described above, a silicon film 100 μm thick was deposited by the epitaxial growth process. In this case, the formation of the silicon nodule 24 (FIG. 7) was prevented, unlike the prior art.

As is shown in FIG. 3, the area on the back surface of the wafer 6, where the protective film 15 is formed, is decreased by $L_2-L_1$, as compared to the prior art. Accordingly, the area of the back side peripheral portion of the wafer 6, which is exposed to the atmosphere within the reaction chamber 3, increases. There is a concern, therefore, that the impurity due to the dopant contained in the wafer may diffuse into the reaction chamber 3 from the increased portion of the exposed area. However, it was found that since the material gas 10 reaches the increased portion of the exposed area, an epitaxial growth film of silicon, though much smaller than the epitaxial growth film on the top surface of the wafer, is formed on the increased portion of the exposed area and this increased portion is completely covered with a silicon film. Thus, the above-mentioned problem did not occur in fact.

As has been described above, according to the method of the present invention, the back side protective film 15 on the wafer is removed from the peripheral portion thereof so that the protective film 15 may not come into contact with the susceptor 4. Thus, formation of a silicon nodule on the back surface of the wafer 6 can be prevented. Therefore, unlike the prior art, there is no need to mechanically polish away a nodule which has formed. As a result, the productivity can be enhanced.

The method of the present invention is applicable to the case where $SiHCl_3$ with a high deposition rate is used as material gas. In this case, too, no problem of auto-dope arises and the productivity is further enhanced.

Figure 4:
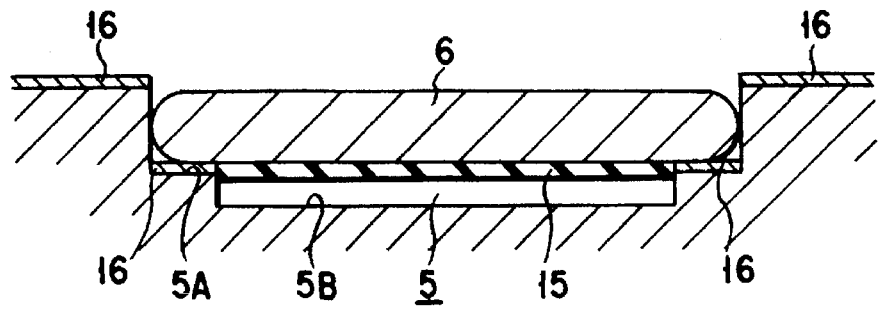
FIG. 4 is a cross-sectional view showing another example of the wafer support member of the susceptor used in the method of the invention.

In particular, when the wafer doped with As (arsenic) at high concentration is used, it is preferable to adopt the following technique. Specifically, like a first modification shown in FIG. 4, a silicon coating is applied in advance to the top surface of the susceptor 4 and the surface of the stepped portion 5A of the depression portion 5, prior to the epitaxial growth process. When the temperatures of the susceptor 4 and wafer 6 have approximately reached a reaction temperature, the silicon coating 16 applied to the stepped portion 5A of the susceptor migrates to the wafer 6 and a silicon film is formed on the back side peripheral portion of the wafer 6. As a result, the impurity due to the dopant contained in the wafer is prevented from diffusing into the inside of the reaction chamber 3. In particular, when $SiHCl_3$ is used as material gas, the HCl concentration increases due to decomposition of the material gas and the wafer 6 is etched. Consequently, the diffusion of the impurity due to the dopant becomes conspicuous. Therefore, the advantage of applying the silicon coating 16 is remarkable.

Figure 5:
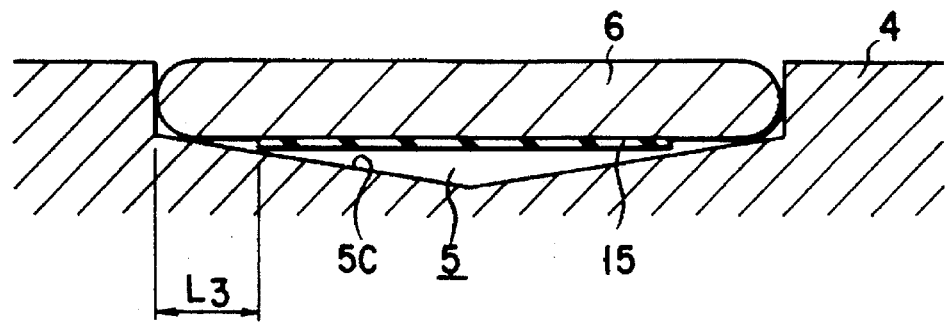
FIG. 5 is a cross-sectional view showing still another example of the wafer support member of the susceptor used in the method of the invention.
Figure 6:
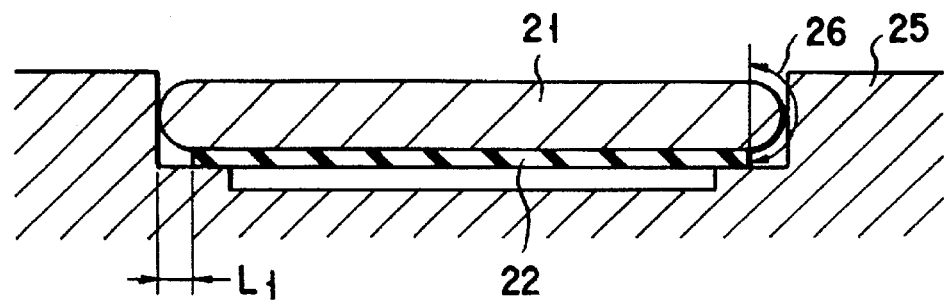
FIG. 6 is a cross-sectional view showing a wafer support member of a conventional susceptor.

FIG. 5 shows a second modification wherein the depression portion 5 includes a bottom portion 5C having a conical cross-sectional shape inclined towards the center of the bottom portion 5C. In this case, the back side protective film 15 in a region defined by $L_3$ is removed, thereby preventing the protective film 15 from coming into direct contact with the susceptor 4. Thus, the same advantage as stated above can be obtained.

As has been described above, the method of vapor phase epitaxial growth according to this invention has the following advantages.

According to the first method of the invention, when a semiconductor film is deposited on the wafer surface by the epitaxial growth process, the back side protective film formed of an oxide or a nitride is removed from the back side portion of the wafer, which is in direct contact with the susceptor. Thereby, the formation of the nodule on the specific region of the back side protective film of the wafer, which is in contact with the susceptor, can be prevented by the relatively simple method and the productivity can be enhanced.

According to the second method, when the semiconductor film is deposited on the wafer surface by the epitaxial growth process, the silicon coating is applied to that portion of the susceptor, which supports the wafer, in addition to the process of the first method. Thus, when the temperatures of the susceptor and wafer have approximately reached a reaction temperature, the silicon coating applied to the surface of the susceptor migrates to the wafer and a silicon film is formed to cover the back side peripheral portion of the wafer. As a result, the impurity due to the dopant contained in the wafer is prevented from diffusing into the inside of the reaction chamber. This method is advantageous, in particular, when $SiHCl_3$ is used as material gas.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of preparing a material wafer for vapor phase epitaxial growth, said method comprising the steps of:

forming a back side protective film on a wafer; and removing said protective film on a back side peripheral portion of the wafer, which is to be in contact with a depression portion, formed in a susceptor situated within a reaction chamber, for supporting the wafer.

2. A method of vapor phase epitaxial growth, comprising the steps of:

providing a susceptor situated within a reaction chamber with a depression portion for supporting an object to be processed at a back side peripheral portion thereof;

preparing a wafer having a back side protective film;

removing the protective film from the back side peripheral portion of the wafer, which is to be in contact with said depression portion; and supporting the wafer, from which the protective film on the back side peripheral portion has been removed, on the depression portion of the susceptor, and depositing a semiconductor film on said wafer by an epitaxial growth process.

3. A method of vapor phase epitaxial growth, comprising the steps of:

providing a susceptor situated within a reaction chamber with a depression portion for supporting an object to be processed at a back side peripheral portion thereof;

applying a silicon coating to that portion of a surface of the depression portion, which is to be in contact with the back side peripheral portion of said object;

preparing a wafer having a back side protective film;

removing the protective film from the back side peripheral portion of the wafer, which is to be in contact with said depression portion; and supporting the wafer, from which the protective film on the back side peripheral portion has been removed, on the depression portion of the susceptor, and depositing a semiconductor film on said wafer by an epitaxial growth process.

4. The method according to claim 3, wherein $SiHCl_3$ is used as a material gas in the epitaxial growth process.

* * * * *